(12) United States Patent
Trampitsch

(10) Patent No.: US 9,077,374 B2
(45) Date of Patent: Jul. 7, 2015

(54) RESOLUTION-BOOSTED SIGMA DELTA ANALOG-TO-DIGITAL CONVERTER

(71) Applicant: Linear Technology Corporation, Milpitas, CA (US)

(72) Inventor: Gerd Trampitsch, Unterfoehring (DE)

(73) Assignee: Linear Technology Corporation, Milpitas, CA (US)

( * ) Notice: Subject to any disclaimer, the term of this patent is extended or adjusted under 35 U.S.C. 154(b) by 4 days.

(21) Appl. No.: 14/052,479

(22) Filed: Oct. 11, 2013

(65) Prior Publication Data

US 2014/0340248 A1 Nov. 20, 2014

Related U.S. Application Data

(60) Provisional application No. 61/824,819, filed on May 17, 2013.

(51) Int. Cl.
*H03M 3/00* (2006.01)
*H03M 1/12* (2006.01)
*H03M 1/00* (2006.01)

(52) U.S. Cl.
CPC ............ *H03M 3/472* (2013.01); *H03M 1/1225* (2013.01); *H03M 3/30* (2013.01); *H03M 1/12* (2013.01); *H03M 1/00* (2013.01); *H03M 3/464* (2013.01); *H03M 3/39* (2013.01); *H03M 3/458* (2013.01)

(58) Field of Classification Search
CPC ........... H03M 3/30; H03M 1/12; H03M 1/00; H03M 1/1225
USPC .................. 341/143, 120, 118, 119, 155, 141
See application file for complete search history.

(56) References Cited

U.S. PATENT DOCUMENTS

| 5,440,305 A * | 8/1995 | Signore et al. ................. 341/120 |
| 5,936,562 A | 8/1999 | Brooks et al. |
| 7,511,648 B2 | 3/2009 | Trifonov et al. |
| 2003/0052806 A1 * | 3/2003 | Hochschild .................... 341/143 |

OTHER PUBLICATIONS

Rossi, Luca, et al. "A 16-bit, 150-µW, 1-kS/s ADC with hybrid incremental and cyclic conversion scheme," ICECS 2009. 16th IEEE International Conference on Electronics, Circuits, and Systems, ICECS 2009, Dec. 2009, 4 pgs.

(Continued)

*Primary Examiner* — Joseph Lauture
(74) *Attorney, Agent, or Firm* — Edward C. Kwok; Hogan Lovells US LLP

(57) ABSTRACT

A method and an ADC circuit use multiple SD modulations on an analog value and apply digital post-processing of the pulse density modulation (PDM) streams from the SD modulations obtaining a higher resolution in the digital output value for a given oversampling ratio. SD ADC does not face the constraint of conversion time doubling for each additional bit of resolution. In one implementation, an SD ADC includes conversions in SD phase and resolution-boosting phase. During SD phase, MSBs of the digital output value are generated from the sampled analog value using a first SD conversion. At the end of SD phase, the sampled analog value is reduced to "residual quantization error," which remains in a capacitor of an integrator of SD ADC. In resolution-boosting phase, the LSBs of the digital output value are generated from residual quantization error using a second SD conversion that provides at least the LSBs.

13 Claims, 3 Drawing Sheets

(56) References Cited

OTHER PUBLICATIONS

Extended European Search Report for Patent Application No. 14001697.3 dated Nov. 21, 2014, 9 pgs.

C. Jansson, A High-Resolution, Compact, and Low-Power ADC Suitable for Array Implementation in Standard CMOS, IEEE Transactions on Circuits and Systems I: Fundamental Theory and Applications 42, Nov. 1995, No. 11, New York, pp. 904-912.

R. Harjani & T. A. Lee, FRC: A Method for Extending the Resolution of Nyquist Rate Converters Using Oversampling, IEEE Transactions on Circuits and Systems—II: Analog and Digital Signal Processing, vol. 45, No. 4, Apr. 1998, pp. 482-494.

J. De Maeyer, P. Rombouts & L. Weyten, A Double-Sampling Extended-Counting ADC, IEEE Journal of Solid-State Circuits, vol. 39, No, 3, Mar. 2004, pp. 411-418.

G. Mulliken, F. Adil, G. Cauwenberghs & R. Genov, Delta-Sigma Algorithmic Analog-to-Digital Conversion, IEEE 2002, pp. IV-687-IV-690.

* cited by examiner

RESOLUTION-BOOSTED SIGMA DELTA ANALOG-TO-DIGITAL CONVERTER

CROSS REFERENCE TO RELATED APPLICATIONS

The present application relates to and claims priority of U.S. provisional patent application ("Provisional Patent Application"), Ser. No. 61/824,819, entitled "Resolution-Boosted Sigma Delta Analog-to-Digital Converter," filed on May 17, 2013. The disclosure of the Provisional Patent Application is hereby incorporated by reference in its entirety.

BACKGROUND OF THE INVENTION

1. Field of the Invention

The present invention relates to an analog-to-digital converter (ADC) using a sigma delta modulation technique. In particular, the present invention relates to an ADC using a sigma delta (SD) modulation technique in which the number of clock cycles required for each conversion is not constrained by the oversampling ratio, unlike conventional $1^{st}$ order SD converters.

2. Discussion of the Related Art

In a conventional $1^{st}$ order SD ADC, the number of clock cycles necessary for each conversion is proportional to the oversampling ratio (OSR), which is given by $OSR=2^N$, where N is the number of bits in the digital output value. Thus, the conversion time doubles for each additional bit of resolution. To obtain a higher resolution without the exponential increase in conversion time, a higher-order SD converter may be used. However, such a SD ADC has a higher complexity and requires a greater converter area because of the higher-order decimation filters and the larger number of integrators required.

Many approaches aimed at overcoming the OSR constraint have been tried. For example, the article "A 16-bit, 150 uW, 1 kS/s ADC with hybrid incremental and cyclic conversion scheme" ("Rossi"), by L. Rossi et al., published in IEEE International Conference on Electronics, Circuits and Systems (ICECS 2009), Medina, Tunisia, Dec. 13-16, 2009, discloses a circuit that uses an SD ADC to obtain the most significant bits (MSBs) and which applies a non-SD ADC—in this case, a cyclic ADC—on the residue to obtain the least significant bits (LSBs) in the output value.

U.S. Pat. No. 5,936,562, entitled "High-speed Sigma Delta ADCs" to Brooks et al., filed on Jun. 6, 1997 and issued on Aug. 10, 1999, also discloses applying a non-SD ADC on the residue to obtain the LSBs in the output value.

U.S. Pat. No. 7,511,648, entitled "Integrating/SAR and Method with Low Integrator Swing and Low Complexity" ("Trifonov"), to D. Trifonov et al., discloses a hybrid approach that uses both SD modulation and non-SD techniques. In this case, the non-SD technique is a successive approximation register (SAR) technique. However, Trifonov's approach requires a control unit to implement the SAR algorithm, a multiply-by-2 circuit, and a complex circuit for combining the results of the SD and the non-SD conversions.

SUMMARY

The present invention provides a method and an ADC circuit that use more than one SD modulation on an analog value, and then applies digital post-processing of the pulse density modulation (PDM) streams from the SD modulations to obtain a higher resolution in the digital output value for a given oversampling ratio. According to one embodiment of the present invention, the SD ADC does not face the constraint of conversion time doubling for each additional bit of resolution. In an SD ADC of the present invention, the conversion includes a SD phase and a resolution-boosting phase. During the SD phase, the MSBs of the digital output value are generated from the sampled analog value using a first SD conversion. At the end of the SD phase, the sampled analog value is reduced to a "residual quantization error," which remains in a capacitor of an integrator of the SD ADC. In the resolution-boosting phase, the LSBs of the digital output value are generated from the residual quantization error using a second SD conversion that provides at least the LSBs. The second SD conversion may be carried out using the same SD ADC as the SD ADC used in the SD phase, except a different set of reference voltages or capacitor values, or both, are used. The reference voltage and capacitor values for each SD conversion are selected based on the analog values and weights represented by the corresponding bits.

According to one embodiment of the present invention, the SD modulator generates, in time-interleaved operations, a first pulse density modulation (PDM) stream and one or more PDM streams, representing the MSBs and LSBs of the digital output value, respectively. The digital output value is obtained by combining in a digital filter the bits represented by the two PDM streams. In one implementation, the combination is achieved as a weighted sum of the MSBs and the LSBs using only ripple up-counters with separate weighting for the PDM streams. Preloading the ripple up-counters eliminates the need for costly up-down counters and allows a zero-crossing point to be set as required in the ADC transfer curve. By using the same SD modulator to generate a number of PDM streams and combining these PDM streams in ripple up-counters, the advantages of the present invention are achieved in a system requiring only a minimal amount of extra circuitry, as compared to a conventional $1^{st}$ order SD converter.

According to one embodiment of the present invention, an algorithm which cancels offsets in the SD conversions may be used.

The present invention is better understood upon consideration of the detailed description below in conjunction with the accompanying drawings.

DETAILED DESCRIPTION OF THE PREFERRED EMBODIMENTS

Figure 1:
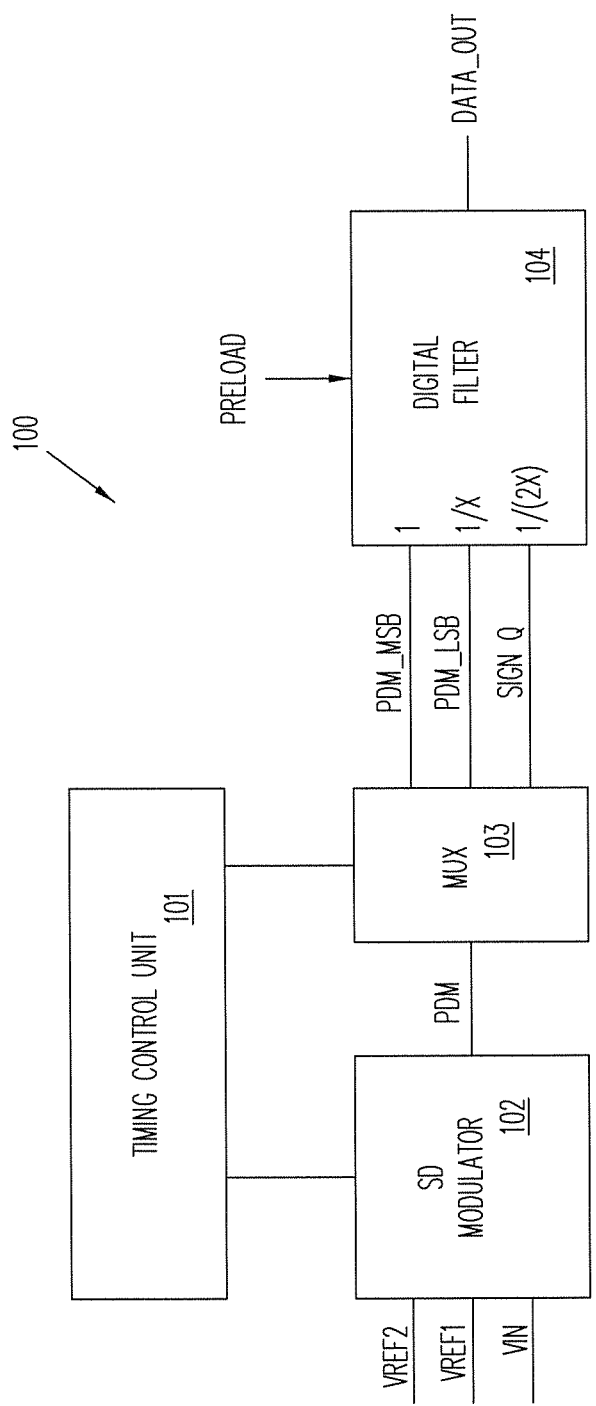
FIG. 1 is a block diagram of ADC circuit 100, according to one embodiment of the present invention.

The present invention provides a method and an ADC circuit that use more than one SD modulation on an analog value, and then applies digital post-processing of the pulse density modulation (PDM) streams from the SD modulations to obtain a higher resolution in the digital output value for a given oversampling ratio. FIG. 1 is a block diagram of ADC circuit 100, according to one embodiment of the present invention.

As shown in FIG. 1, ADC circuit 100 includes a SD modulator 102, which receives input signal Vin, first reference signal Vref1 and second reference signal Vref2. As explained in further details below, SD modulator 102 can selectively use first reference signal Vref1 or second reference signal Vref2 to provide a PDM stream using SD modulation of input signal Vin. The PDM stream from SD modulator 102 may be selectively provided by multiplexer 103 as PDM_MSB stream or as PDM_LSB stream, representing the MSBs and the LSBs in the digital representation of input signal Vin, respectively. Under control of timing control unit 101, SD modulator 102 first samples input signal Vin and reference voltage Vref1 to provide through multiplexer 103 the PDM_MSB stream that represents the MSBs of the digital representation of input signal Vin ("SD phase"). After the oversample ratio for the MSBs (i.e., $2^N$, where N is the number of bits in the MSBs) of clock cycles, under control of timing control unit 101, SD modulator 102 then stops sampling input signal Vin and uses reference voltage Vref2 to provide through multiplexer 103 the PDM_LSB stream that represents the LSBs of the digital representation of input signal Vin ("resolution-boosting phase"). At the end of the SD phase, the sampled analog value is reduced to a "residual quantization error," which remains in capacitors of an integrator in SD modulator 102. During the resolution boosting phase, the LSBs are provided over the oversampling ratio for the LSBs (i.e., $2^M$, where M is the number of bits in the LSBs). FIG. 3 shows the quantized steps for the MSBs (dotted graph 301) and the LSBs (solid graph 302), encoding 1 bit and 2 bits using reference signals Vref1 and Vref2, respectively, in accordance with one embodiment of the present invention. At the end of the $2^M$ clock cycles in the resolution-boosting phase, a further residual quantization error may still remain in the capacitors of an integrator in ADC circuit 100 (see, e.g., capacitors 204-1 and 204-2 of FIG. 2, described below). That residual quantization error may be positive or negative (indicated by signal Sign Q, and provides an additional bit of resolution after providing it an appropriate weight relative to the weight of the least significant bit. Digital filter 104 combines the Sign Q bit, the MSBs and the LSBs to provide the digital representation of input Vin as output value Data_out. As shown in FIG. 1, a Preload value is provided to digital filter 104, which sets a zero-crossing value in one embodiment, as discussed in further detail below with respect to FIG. 2.

In one embodiment, two conversions are performed on input signal Vin ("offset elimination mode"), one of which having the polarity of input signal Vin reversed. The difference of the two conversions represents twice the digital value of input signal Vin. Using this technique, any offset voltage in ADC circuit 100 may be eliminated. Digital filter 104 combines the two sets of MSBs and LSBs to provide the digital representation of input Vin as output value Data_out.

Figure 2:
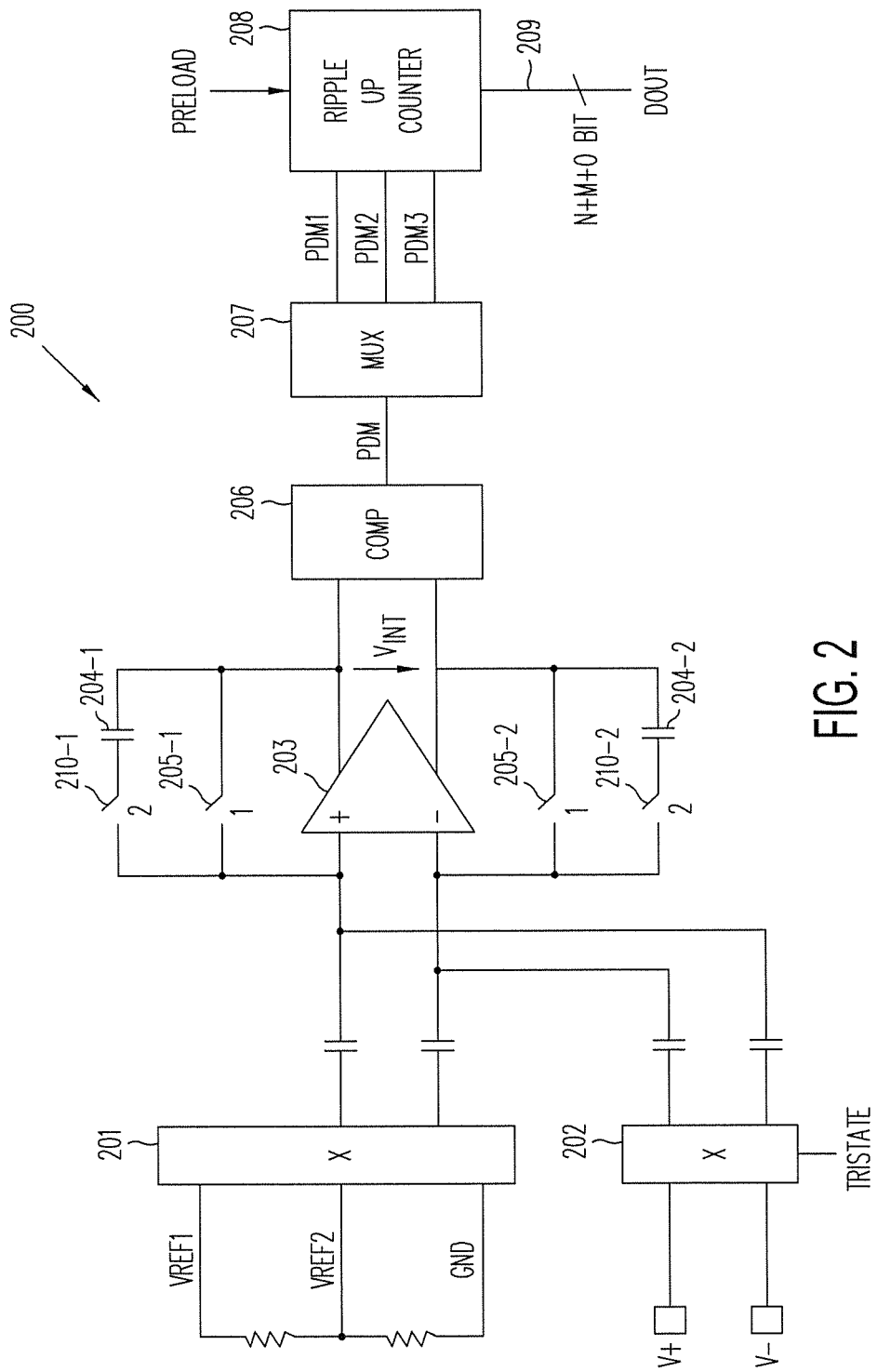
FIG. 2 shows schematically ADC circuit 200, which is one implementation of ADC 100, according to one embodiment of the present invention.
Figure 3:
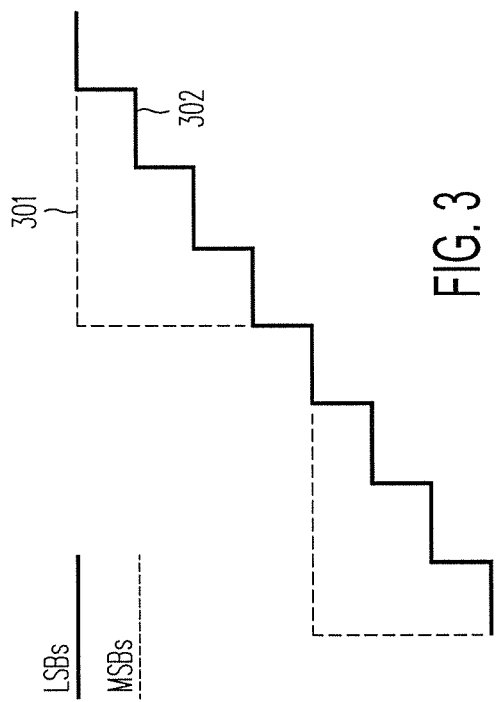
FIG. 3 shows the quantized steps for the MSBs (dotted graph 301) and the LSBs (solid graph 302), encoding 1 bit and 2 bits using reference signals Vref1 and Vref2, respectively, in accordance with one embodiment of the present invention.
Figure 4:
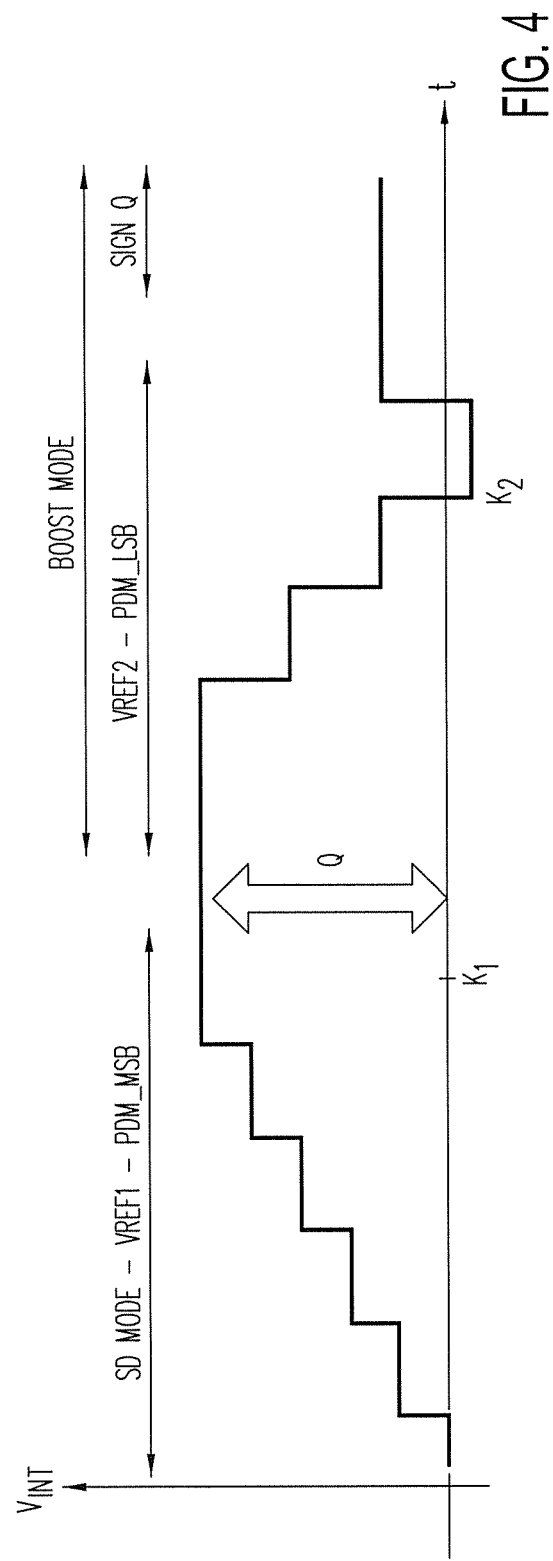
FIG. 4 illustrates the voltage level in capacitor 204-1 or 204-2 during the SD phase and the resolution-boosting phase during the course of one conversion, according to one embodiment of the present invention.

FIG. 2 shows schematically ADC circuit 200, which is one implementation of ADC 100, according to one embodiment of the present invention. As shown in FIG. 2, multiplexers 201 and 202 sample the reference voltage (i.e., either Vref1 or Vref2) and input signal Vin (either polarity) into circuit 200. During the SD phase, reference voltage Vref1 is selected; during the resolution-boosting phase, reference voltage Vref2 is selected. In offset elimination mode, the first set of SD conversion selects input signal Vin, while the second set of SD conversion selects input signal –Vin. The sampled reference voltage and sampled input signal Vin are integrated in the integrator formed by differential amplifier 203 and capacitors 204-1 and 204-2. Switches 210-1 and 210-2 are closed to initiate the integration. The integrator may be reset by closing switches 205-1 and 205-2 momentarily to discharge capacitors 204-1 and 204-2. Comparator 206 detects when a predetermined threshold (e.g., the ground reference) is reached, provides an output pulse in its output PDM stream and determines the polarity of the reference sampling. At the end of the SD phase, the sampled analog value is reduced to a "residual quantization error," which remains in capacitors 204-1 and 204-2 of the integrator in ADC circuit 200. During the SD phase, multiplexer 207 provides comparator 206's PDM stream as PDM1 stream; during the resolution-boosting phase, multiplexer 207 provides comparator 206's PDM stream as PDM2 stream. After $2^M$ clock cycles in the resolution-boosting phase, a further residual quantization error may still remain in capacitors 204-1 and 204-2 of the integrator in ADC circuit 200. That residual quantization error may be positive or negative, and is detected and indicated in signal Sign Q (or PDM3). This value may be used to provide an additional bit of resolution, after giving it an appropriate weight relative to the weight of the LSBs. FIG. 4 illustrates the voltage level in capacitor 204-1 or 204-2 during the SD phase and the resolution-boosting phase during the course of one conversion, according to one embodiment of the present invention. Counter 208 includes an MSB counter that increments whenever a pulse is detected in the PDM1 stream and an LSB counter that increments whenever a pulse is detected in the PDM2 stream.

In one implementation, the combination of PDM streams and sign bit is achieved by a weighted sum of the PDM streams and a sign bit, using ripple up-counters. Due to circuit imperfections (e.g., asymmetric charge injection), the residual quantization error may be greater than one MSB. In that case, the quantization error is too large for the resolution-boosting phase. To extend the signal range of the resolution-boosting phase, the second PDM stream (PDM2) is increased to have $2^M+X$ bits. The longer PDM stream causes a shift in the zero-crossing point in the ADC transfer curve. Preloading the ripple counter allows the zero-crossing point of the ADC transfer curve to be set to a desired value. Using the same SD modulator to generate the N PDM streams and a sign bit, and combining these PDM streams in ripple up-counters, the advantages of the present invention may be achieved using a system of only minimal extra circuitry. The present invention is able to perform faster, more accurate signal conversions, or both, as compared to a conventional $1^{st}$ order SD converter at the cost of a little extra circuitry.

The above detailed description is provided to illustrate the specific embodiments of the present invention and is not intended to be limiting. Numerous variations and modifications within the scope of the present invention are possible. The present invention is set forth in the accompanying claims.

I claim:

1. An analog-to-digital converter (ADC) receiving an analog signal as input and providing an output digital value representative of the analog signal, comprising:
    a first multiplexer receiving two or more reference signals to provide a selected reference signal;
    a sigma delta modulator receiving the selected reference signal and the analog signal to provide a set of pulses representative of the analog signal received;
    a control circuit causing the first multiplexer to select (i) in a first phase of a conversion, a first one of the reference signals as the selected reference signal and (ii) in subsequent phases of the conversion, the other reference signals, one at a time, as the selected reference signal, such that the sigma delta modulator provides, respectively, a first set of pulses in the first phase and an additional set of pulses in each of the subsequent phases of the conversion; and a digital circuit combining in each conversion the first set and the subsequent sets of pulses to provide the digital output value.

2. The ADC of claim 1, wherein the first set of pulses represents the most significant bits of the digital output value, and wherein the additional sets of pulses represent the least significant bits of the output digital value.

3. The ADC of claim 1, a second multiplexer selectively providing the analog signal in a first polarity and in a second polarity that is opposite the first polarity.

4. The ADC of claim 3, wherein the control circuit performs a first conversion and a second conversion using, respectively, the analog signal in the first polarity and the analog signal in the second polarity, and wherein the digital circuit provides a final output digital value based on the respective digital output values obtained in the first and second conversions.

5. The ADC of claim 1, wherein the digital circuit comprises one or more up-counters that are each reset and preloaded with a predetermined value before each conversion.

6. The ADC of claim 1, wherein the sigma delta modulator in each subsequent phase converts a residual quantization error.

7. The ADC of claim 6, wherein at the end of each subsequent phase, the polarity of the residual quantization error then present is used to further refine the output digital value.

8. A method for analog-to-digital conversion of an analog signal as input to provide an output digital value representative of the analog signal, comprising:

In a first multiplexer, selecting as a selected reference signal (i) a first reference signal in a first phase of conversion, and (ii) one or more reference signals, one at a time, in subsequent phases of the conversion;

providing the analog signal and the selected reference signal to a sigma delta modulator to create, respectively, a first set of pulses and an additional set of pulses in the first phase and each of the subsequent phases, respectively; and combining in a digital circuit the first set and the subsequent sets of pulses to provide the output digital value.

9. The method of claim 8, wherein the first set of pulses represents the most significant bits of the output digital value, and wherein the additional sets of pulses represent the least significant bits of the output digital value.

10. The method of claim 8, wherein the method performs a first analog-to-digital conversion and a second analog-to-digital conversion, in which the first analog-to-digital conversion provides the analog signal in the first polarity and the second analog-to-digital conversion is performed with the analog signal in the second polarity opposite the first polarity, and wherein the digital circuit provides the output digital value based on the digital output values corresponding to the first and second analog-to-digital conversions.

11. The method of claim 8, wherein the digital circuit comprises one or more up-counters that are each reset and preloaded with a predetermined value before each conversion.

12. The method of claim 8, wherein the analog signal received into the sigma delta modulator in each of the subsequent phases of the conversion represents a residual quantization error.

13. The method of claim 12, further comprising, at the end of each of the subsequent phases, refining the output digital value using the polarity of the residual quantization error then present.

* * * * *